(12) United States Patent
Rackauckas et al.

(10) Patent No.: US 12,086,513 B2
(45) Date of Patent: Sep. 10, 2024

(54) SOLVER FOR SCIENTIFIC COMPUTING THAT DETECTS AND HANDLES DISCONTINUITIES OR IRREGULARITIES IN A SIMULATION

(71) Applicant: JuliaHub, Inc., Boston, MA (US)

(72) Inventors: Christopher Rackauckas, Cambridge, MA (US); Viral B. Shah, Cambridge, MA (US); Yingbo Ma, Newton, MA (US)

(73) Assignee: JuliaHub, Inc., Boston, MA (US)

( * ) Notice: Subject to any disclaimer, the term of this patent is extended or adjusted under 35 U.S.C. 154(b) by 0 days.

(21) Appl. No.: 18/606,394

(22) Filed: Mar. 15, 2024

(65) Prior Publication Data

US 2024/0249042 A1 Jul. 25, 2024

Related U.S. Application Data

(63) Continuation of application No. PCT/US2022/076521, filed on Sep. 16, 2022.

(60) Provisional application No. 63/245,620, filed on Sep. 17, 2021.

(51) Int. Cl.
*G06F 30/20* (2020.01)

(52) U.S. Cl.
CPC .................... *G06F 30/20* (2020.01)

(58) Field of Classification Search
CPC .. G06N 7/06; G10H 2250/165; F25J 2290/10; G05B 2219/35151; G06F 11/3447
See application file for complete search history.

(56) References Cited

U.S. PATENT DOCUMENTS

| | | | |
|---|---|---|---|
| 7,035,782 B2 * | 4/2006 | Yang | G06F 17/13 703/2 |
| 7,647,213 B1 | 1/2010 | Gahinet et al. | |
| 2004/0133410 A1 | 7/2004 | Ethridge et al. | |
| 2018/0113235 A1 | 4/2018 | Laverne | |

OTHER PUBLICATIONS

ISA/US; International Search Report and Written Opinion for corresponding PCT Patent Application No. PCT/US2022/076521, mailed Dec. 15, 2022, 6 pages.
WIPO, International Preliminary Report on Patentability for corresponding PCT Patent Application No. PCT/US2022/076521, dated Mar. 5, 2024, 5 pages.

* cited by examiner

*Primary Examiner* — Andy Ho
(74) *Attorney, Agent, or Firm* — NK Patent Law

(57) ABSTRACT

Methods, systems, and computing devices of a solver for detecting discontinuities or irregularities in a simulation in scientific computing is disclosed. The solver detects a discontinuity or irregularity using two phases: a crude phase, and a fine phase. The crude phase determines an estimate of where the discontinuity is located by extrapolating the interpolant. The fine phase iteratively refines the location of the discontinuity using root-finding and simplified Newton iterations. The solver disclosed herein takes fewer steps when running a simulation because it accurately steps over the discontinuities.

20 Claims, 6 Drawing Sheets

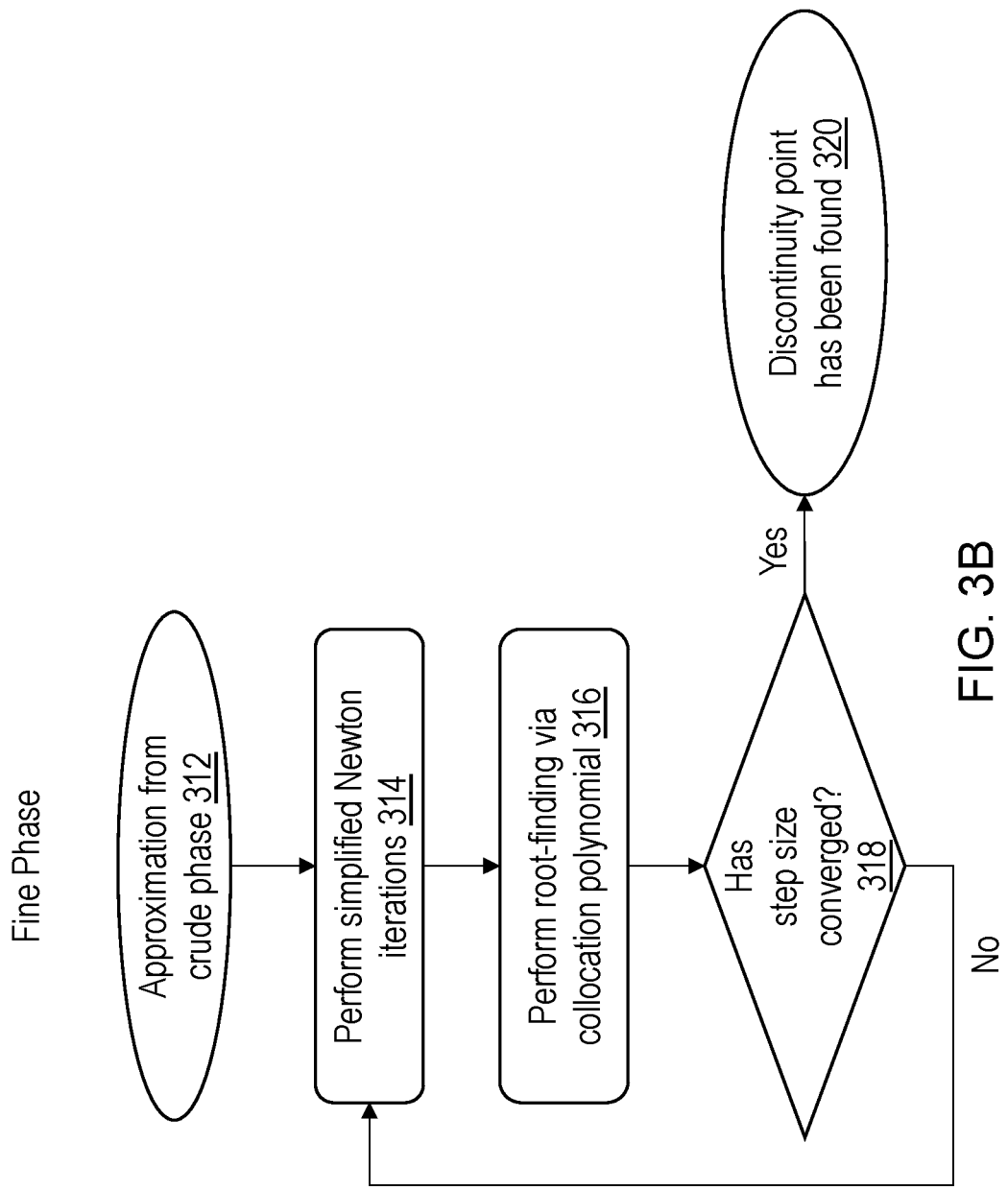

SOLVER FOR SCIENTIFIC COMPUTING THAT DETECTS AND HANDLES DISCONTINUITIES OR IRREGULARITIES IN A SIMULATION

CROSS-REFERENCE TO RELATED APPLICATIONS

This application is a continuation of PCT Patent Application No. PCT/US2022/076521 filed on Sep. 16, 2022, by JuliaHub, Inc., entitled "SOLVER FOR SCIENTIFIC COMPUTING THAT DETECTS AND HANDLES DISCONTINUITIES OR IRREGULARITIES IN A SIMULATION," which claims priority to U.S. Provisional Patent Application No. 63/245,620 filed on Sep. 17, 2021, by JuliaHub, Inc., entitled "SOLVER FOR SCIENTIFIC COMPUTING THAT DETECTS AND HANDLES DISCONTINUITIES OR IRREGULARITIES IN A SIMULATION," the entire contents of all of which are incorporated by reference herein.

GOVERNMENT SUPPORT

This invention was made with U.S. Government support under ARPA-E Award No. DE-AR0001222, awarded by ARPA-E. The Government has certain rights in this invention.

TECHNICAL FIELD

The field of the invention relates generally to scientific computing. More specifically, the field of invention relates to a solver in scientific computing that detects and handles discontinuities or irregularities in a simulation.

BACKGROUND

In scientific computing, solvers are well-known. Traditional solvers, however, do not efficiently or effectively handle simulations that contain one or more discontinuities or irregularities because the non-smoothness invalidates the solvers' assumptions, which causes problems with the simulation at the location of the irregularity. This leads to slow and inaccurate simulations that do not correctly represent the system being modeled.

Accordingly, there is a need for a solver that can handle discontinuities or non-smoothness in a simulation.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

The solver described herein addresses the above-identified problems by locating a discontinuity or irregularity in a simulation and adjusting the simulation accordingly.

A solver for detecting discontinuities or irregularities in a simulation in scientific computing is disclosed. The solver detects a discontinuity or irregularity using two phases: a crude phase, and a fine phase. The crude phase determines an estimate of where the discontinuity is located by extrapolating the interpolant. The fine phase iteratively refines the location of the discontinuity using root-finding and simplified Newton iterations. The solver takes fewer steps when running a simulation because it accurately steps over the discontinuities or irregularities.

In a first embodiment, a method for detecting discontinuities in a simulation by a solver in scientific computing is disclosed. The method includes constructing a collocation polynomial over an integration interval. The method further includes determining an estimate of a point within the integration interval where a discontinuity is located. The method further includes refining the estimate of the point where the discontinuity is located. The estimate is refined using root-finding and simplified Newton iterations.

In a second embodiment, a method for detecting discontinuities in a simulation by a solver in scientific computing is disclosed. The method includes constructing a collocation polynomial over an integration interval. The method further includes determining an estimate of a point within the integration interval where a discontinuity is located. The method further includes refining the estimate of the point where the discontinuity is located. The estimate is refined using root-finding and simplified Newton iterations. The refining the estimate of the point where the discontinuity is located includes performing simplified Newton iterations with an estimate of a step size. The refining the estimate of the point where the discontinuity is located further includes performing root-finding via the collocation polynomial to update the estimate of the step size. The refining the estimate of the point where the discontinuity is located further includes while the step size has not converged, performing additional simplified Newton iterations using the updated estimate of the step size, and performing additional root-finding via the collocation polynomial to update the estimate of the step size.

In a third embodiment, a computing device with a solver for detecting discontinuities in a simulation by in scientific computing is disclosed. The computing device includes a memory and at least one processor. The at least one processor is configured for constructing a collocation polynomial over an integration interval. The at least one processor is further configured for determining an estimate of a point within the integration interval where a discontinuity is located. The at least one processor is further configured for refining the estimate of the point where the discontinuity is located. The estimate is refined using root-finding and simplified Newton iterations.

In a fourth embodiment, a computing device with a solver for detecting discontinuities in a simulation by in scientific computing is disclosed. The computing device includes a memory and at least one processor. The at least one processor is configured for constructing a collocation polynomial over an integration interval. The at least one processor is further configured for determining an estimate of a point within the integration interval where a discontinuity is located. The at least one processor is further configured for refining the estimate of the point where the discontinuity is located. The estimate is refined using root-finding and simplified Newton iterations. The refining the estimate of the point where the discontinuity is located includes performing simplified Newton iterations with an estimate of a step size. The refining the estimate of the point where the discontinuity is located further includes performing root-finding via the collocation polynomial to update the estimate of the step size. The refining the estimate of the point where the discontinuity is located further includes while the step size has not converged, performing additional simplified Newton iterations using the updated estimate of the step size, and performing additional root-finding via the collocation polynomial to update the estimate of the step size.

In embodiments of the methods and computing devices disclosed herein, the collocation polynomial represents a non-linear system being modeled by the simulation.

In embodiments of the methods and computing devices disclosed herein, the estimate is determined based on where a solution to the collocation polynomial equals zero.

In embodiments of the methods and computing devices disclosed herein, the root-finding is complete when the step size converges.

In embodiments of the methods and computing devices disclosed herein, a root-finding problem for the root-finding is generated from a symbolic domain representation.

In embodiments of the methods and computing devices disclosed herein, the symbolic domain representation is scanned for irregularities.

In embodiments of the methods and computing devices disclosed herein, the step size is placed such that the discontinuity is captured by a step of the solver.

In embodiments of the methods and computing devices disclosed herein, the root-finding is performed on the collocation polynomial to refine an initial guess of an estimate of a solution of the collocation polynomial.

In embodiments of the methods and computing devices disclosed herein, the root-finding is unable to find an approximation for a current step because the simplified Newton iterations fail to converge.

In embodiments of the methods and computing devices disclosed herein, the simplified Newton iterations are performed by an implicit stiff solver.

In embodiments of the methods and computing devices disclosed herein, the simplified Newton iterations approximate a solution point $t_n+dt$, where $t_n$ is current time and dt is current step size.

In embodiments of the methods and computing devices disclosed herein, the root-finding solves the equation $r(p_n(t_n+dt))=0$, where $p_n$ is the collocation polynomial, r is a root-finding function, $t_n$ is current time, and dt is step size that is being solved for.

In embodiments of the methods and computing devices disclosed herein, an initial value for the estimate of the step size is determined by extrapolating an interpolant of the collocation polynomial.

In embodiments of the methods and computing devices disclosed herein, the point within the integration interval where the discontinuity is located is found when the step size converges.

BRIEF DESCRIPTION OF THE DRAWINGS

The present embodiments are illustrated by way of example and are not intended to be limited by the figures of the accompanying drawings.

FIG. 3B depicts an exemplary method for performing the fine phase of determining an estimate of where a discontinuity is located as part of the method of FIG. 3A, according to the subject matter disclosed herein.

DETAILED DESCRIPTION

The following description and figures are illustrative and are not to be construed as limiting. Numerous specific details are described to provide a thorough understanding of the disclosure. In certain instances, however, well-known or conventional details are not described in order to avoid obscuring the description. References to "one embodiment" or "an embodiment" in the present disclosure may be (but are not necessarily) references to the same embodiment, and such references mean at least one of the embodiments.

Described herein is a solver that handles discontinuities or irregularities that cause traditional solvers to fail. The solver described herein may be implemented as a method or a computer system or computer device. The solver described herein provides a practical application in that improves the operation of simulators used for highly complex scientific computing. As described in more detail below, traditional solvers either fail completely or provide inaccurate solutions when faced with simulations that include a discontinuity or irregularity. The solver described herein provides for simulations that can be run to completion, run more quickly, and provide more accurate simulations than traditional solvers. This provides a practical benefit of providing faster and more accurate solvers and simulators that can model systems that cannot be accurately modeled using traditional simulators or solvers.

Figure 1A:
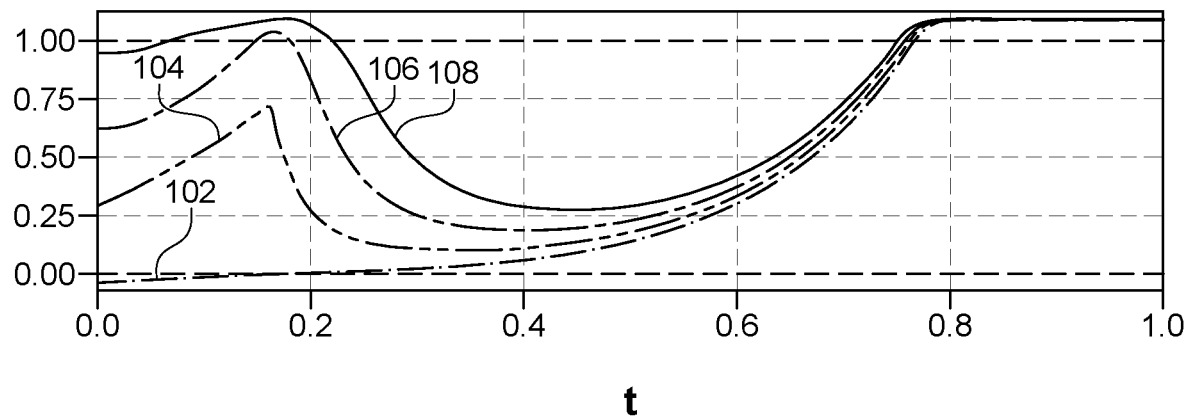
FIG. 1A depicts a graph showing phase change vs. time for a simulation of an HVAC cycle.
Figure 1B:
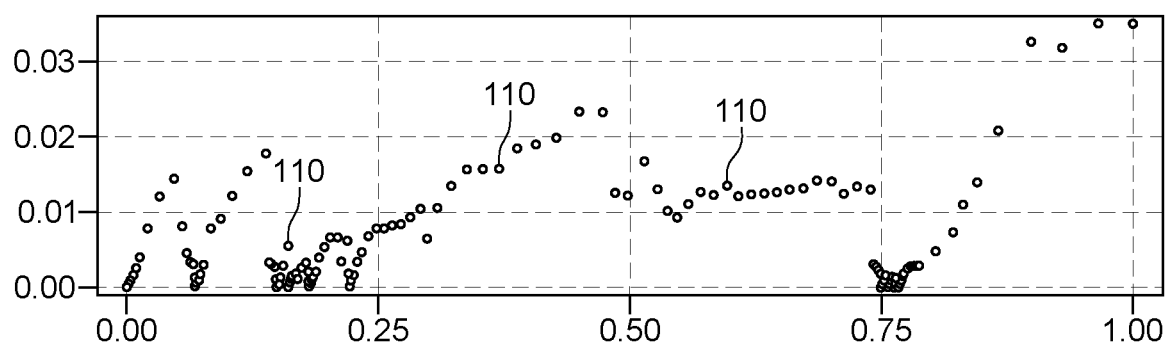
FIG. 1B depicts a graph showing step size vs. time for the simulation of an HVAC cycle shown in FIG. 1A.

Many techniques in modeling and simulation, for example, in scientific computing, assume that a solution has a certain level of smoothness to allow the model or simulation to operate at full efficiency. However, this assumption may be incorrect or broken in certain situations. For example, in cases like modeling HVAC systems, the refrigerant properties may undergo a phase change in the middle of a simulation, and this phase change causes an instantaneous change in the underlying system. When a traditional simulation method is used on this kind of system, the traditional simulator tends to require small time steps to resolve this behavior, as depicted in FIGS. 1A and 1B. The methods and systems described herein solve this problem by detecting such discontinuities within a simulation and handling them efficiently and accurately.

The solver described herein may be implemented as a standalone compiler or as an add-on to an existing compiler. Applicant Julia Computing, Inc. has built a core modeling component of JuliaSim, called ModelingToolkit.jl. The solver described herein may be added as a component to JuliaSim's ModelingToolkit.jl.

JuliaSim's ModelingToolkit.jl automatically performs advanced transformations of a SPICE library in a way that is generalized to all differential equations. ModelingToolkit.jl takes a multi-faceted approach to the lowering process so that all forms of the equations can be investigated. The three types of forms are:

(1) ODEProblem. The ODEProblem form is a representation of the differential-algebraic equation ("DAE") systems using the mass matrix form $Mu'=f(u,t)$ with a singular mass matrix.

(2) ODAEProblem. The ODAEProblem form is the over-determined differential equation formulation, where non-linear solvers of the algebraic equations are embedded into the differential equations to arrive at a formulation $u'=f(u,t)$.

(3) DAEProblem. The DAEProblem form is a fully implicit DAE specification $f(u',u,t)=0$. The DAEProblem form matches the implementation that is common across many DAE solvers, such as SUNDIALS's IDA method.

FIG. 1A depicts a graph showing phase change vs. time for a simulation of an HVAC cycle. Referring to FIG. 1A, lines 102 (xs1), 104 (xs2), 106 (xs3), and 108 (xs4) show the phase change versus time.

FIG. 1B depicts a graph showing step size vs. time for the simulation of an HVAC cycle shown in FIG. 1A. Referring to FIG. 1B, steps 110 are clustered around the irregularities, indicating smaller step sizes at the irregularities.

As can be seen from FIGS. 1A and 1B, there are irregularities in the state when the quantities are 0 or 1. These irregularities are given by the discontinuities in the derivative, specifically discontinuities in the density of the fluid which causes the dynamical system to have a sharp change. Irregularities in the state, such as those shown in FIGS. 1A and 1B, cause traditional solvers to take small time steps, as can be seen by the plot in FIG. 1B.

Figure 2:
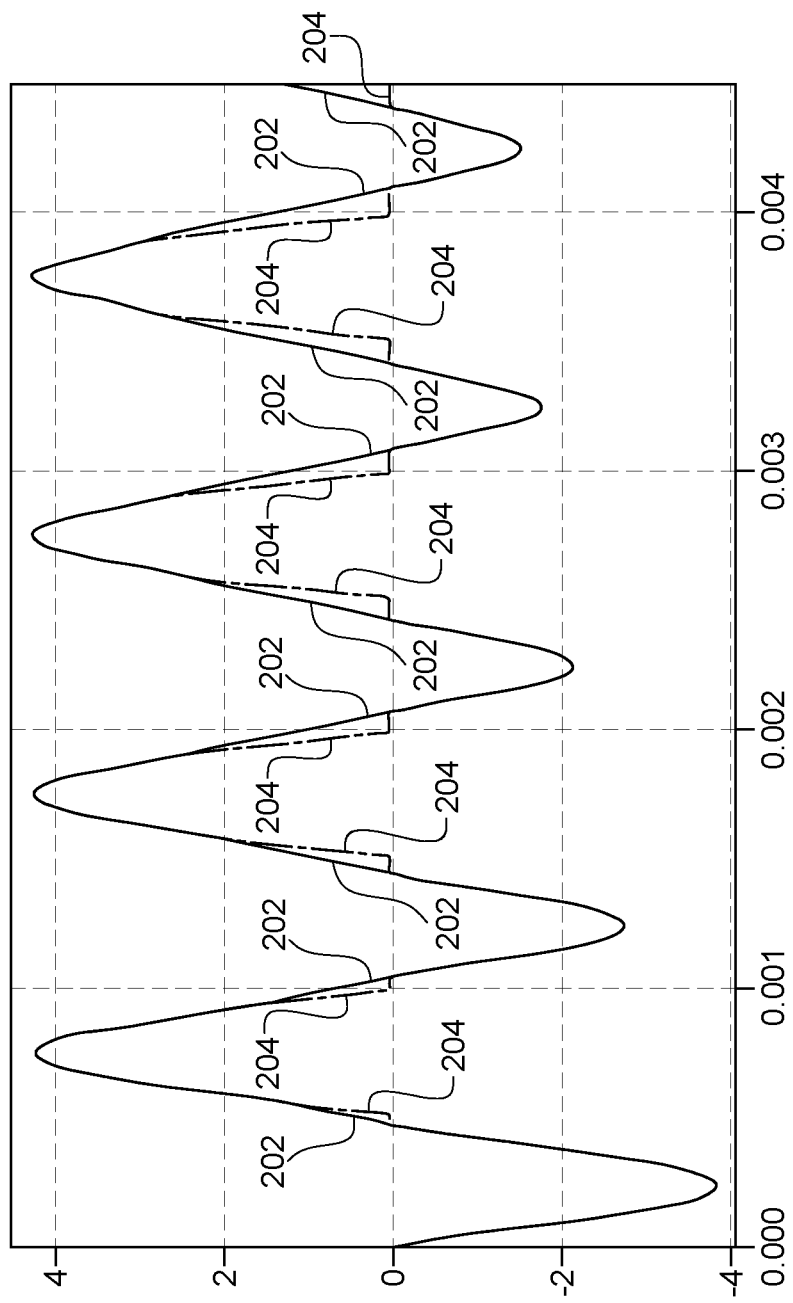
FIG. 2 depicts a graph of the solution of a diode model given by the ODAEProblem solution at high accuracy with a $4^{th}$-order Rosenbrock method compared to a lower-accuracy solution given by the DAEProblem solver IDA.

FIG. 2 depicts the solution 204 of a diode model given by the ODAEProblem solution at high accuracy (tolerances 1e-14) with a $4^{th}$-order Rosenbrock method compared to a lower-accuracy solution 202 given by the DAEProblem solver IDA.

Referring to FIG. 2, the solution given by the DAEProblem solver IDA is shown as line 202, and the solution given by the $4^{th}$-order Rosenbrock method is shown as line 204. As can be seen in FIG. 2, the two solutions (i.e., lines 202 and 204) are essentially the same (i.e., the two lines overlap) for much of the solutions. However, the two solutions diverge (i.e., the two lines do not overlap) near 0. The difference between the two solutions 202 and 204 shown in FIG. 2 is because the algebraic equations exhibit two branches near the zero of the equations, which causes a jump when one of the branches becomes unstable. Thus, v1+n+v(t), which is the solution 204, is correct, while v1.n.v(t), which is the solution 202, is a smoothed approximation. The v1.n.v(t) line 202 matches NgSpice.

Attempting to directly solve the model at low tolerances with the ODEProblem and DAEProblem approaches leads to traditional solvers exiting because this discontinuity cannot be adequately handled to tolerance. Thus, the standard SPICE implementations are missing detailed phenomena that arises due to the algebraic switching, which can only easily be captured by traditional solvers on the non-linear torn ODAEProblem formulation. Notably, traditional solvers like IDA may be seen as not robust on this formulation of the diode model because such switching can cause the solver to exit if the tolerances are not tuned. NgSpice does not exhibit such instabilities because it simply does not allow adaptivity. In other words, the fixed-time-step solvers will smooth the equation without checking the amount of error in the step. Thus, the ODEProblem solvers such as Trapezoid and Rosenbrock23 handle this equation similar to NgSpice when adaptivity is turned off and a fixed time step is chosen.

The solver described herein relies on the fact that many ODE integrators both (1) implicitly assume that the differential equation's definition is sufficiently smooth in order to construct high-order interpolations and estimates; and (2) compute error estimates to perform adaptive time stepping to control the error as the solution is computed.

For example, the solver described herein may implement a 5th-order Radau method, which constructs a $2^{nd}$-order or $3^{rd}$-order collocation polynomial over the interval being implicitly computed. The solver uses simplified Newton iterations over the interval to refine the initial guess to the true solution. If the Newton iterations fail to converge, or if the step controller rejects the step, then the solver extrapolates the interpolant from the last step to do a crude check on the discontinuity. If the solver determines that there may be (i.e., suspects) a discontinuity in the current step, the solver runs a root-finding method in each simplified Newton iteration to locate the precise time point of the discontinuity, and then the step can take place exactly to the discontinuity. The reason for only stepping to the discontinuity is because, given the assumptions of the method, a step over the discontinuity would result in higher error than the estimates and thus decrease the overall quality of the solution.

The collocation polynomial provides a continuous approximation to the solution of the time evolution of the system being modeled. It therefore allows an estimate for the system to be determined for any given point in time within the integration interval. The definition of the collocation polynomial is determined by the solver. The collocation polynomial is used to determine the approximate location of where the discontinuity occurs. This is done by looking at when the user-supplied root-finding problem equals zero. The user-supplied root-finding function may be supplied by a person, or it may be supplied by another algorithm. The point at which the user-supplied root-finding problem is zero represents the location where the discontinuity is located. Thus, if the solution to the collocation polynomial at a particular location is positive, for example, then the discontinuity exists before that particular location. If, on the other hand, the solution to the collocation polynomial at the particular location is negative, for example, then the discontinuity exists after that particular location. This is just one example; the polarity may be reversed.

According to the subject matter disclosed herein, the approximate location of the discontinuity is found by performing root-finding on the collocation polynomial. The root-finding is performed repeatedly to continuously refine an initial guess by moving the guess according to whether the solution to the discontinuity is positive or negative. This is repeated until the approximate location has converged closely enough to zero, as determined, for example, by a threshold value. The solver described herein has the effect of placing the step size in such a way that the discontinuities or irregularities are captured by a solver step.

The irregularity may be specified by the user. In a symbolic ecosystem, such as, for example, the Julia programming language, the root-finding problem can be generated from the symbolic domain. This allows for the solver described herein to scan for irregularities.

For example, consider the following scenario: If $x<0$, then function $f1(x)$ applies; otherwise function $f2(x)$ applies. There can be an assumption that 0 is likely the location where a discontinuity or irregularity will exist. Therefore, it would be helpful to know where x equals 0 because that is where the change occurs from function $f1(x)$ to function $f2(x)$.

Scanning can be used at the symbolic domain level to look for non-smooth or discontinuous functions that exhibit the type of behavior that may lead to discontinuities in the (high-order) derivatives. These include, for example, if statements, absolute value functions, min/max functions, and the like. Thus, one method of detecting discontinuities includes converting the system into a symbolic domain representation and then scanning that symbolic domain representation to identify non-smooth functions.

The solver described herein uses a two-phase approach to detecting and locating the discontinuity. The two-phase approach includes an initial crude phase and then a fine phase. During the crude phase, the solver determines if there is a possibility of an irregularity in the current step before spending the resources on the computationally expensive fine phase. If the solver determines that there is a possibility of an irregularity in the current step, then the solver goes to the fine phase. During the fine phase, the solver performs root-finding along with simplified Newton iterations to locate the irregularity. The irregularity is found when the step size converges (i.e., the solver exits when it meets a threshold). The solver described herein may be equally used to locate discontinuities as well as other types of irregularities or non-smoothness.

Figure 3A:
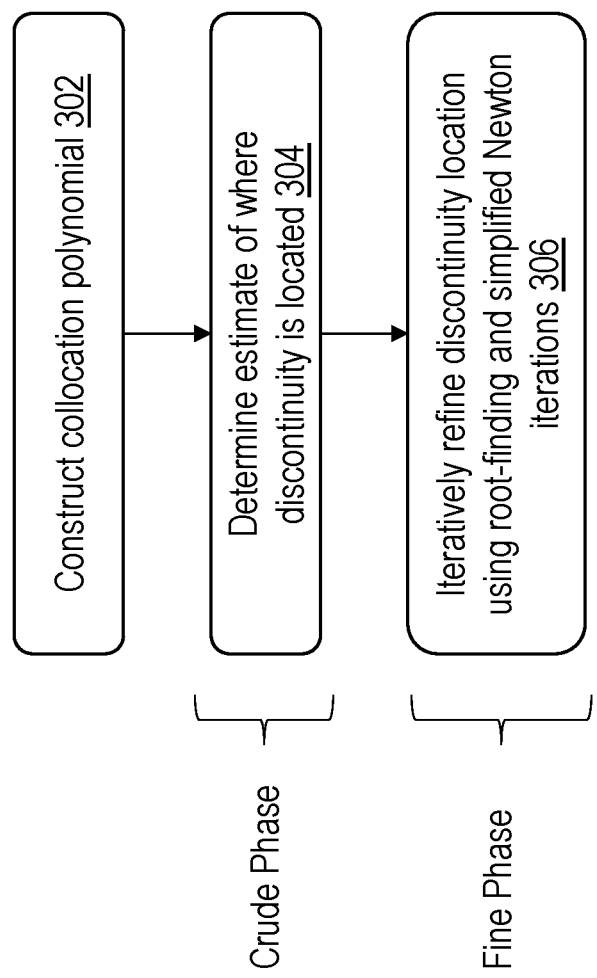
FIG. 3A depicts an exemplary method for detecting discontinuities in a simulation by a solver in scientific computing according to the subject matter disclosed herein.

FIG. 3A depicts an exemplary method for detecting discontinuities in a simulation by a solver in scientific computing according to the subject matter described herein. The method described in the context of FIG. 3A may be implemented by at least one processor or other circuitry in a computing device such as the exemplary computing device shown in FIG. 4 or a system comprising one or more computing devices such as the exemplary device shown in FIG. 4.

Referring to FIG. 3A, the solver, at block 302, constructs a collocation polynomial over an integration interval. The integration interval may have a begin point and an end point. The collocation polynomial represents a non-linear system being modeled by the simulation.

At block 304, the solver determines an estimate of a point within the integration interval where a discontinuity is located. This is the crude phase of the two-phase approach to detecting and locating the discontinuity. This is performed by extrapolating the interpolant. Extrapolation is the process of estimating points outside of the integration interval. The interpolant is evaluated outside the integration interval to determine if there is a zero-crossing of the root-finding function.

At block 306, the solver iteratively refines the discontinuity location using root-finding and simplified Newton iterations. This is the fine phase of the two-phase approach to detecting and locating the discontinuity. For example, the solver refines the estimate of the point where the discontinuity is located. The estimate is refined using root-finding and simplified Newton iterations. The details of block 306 are further described in the context of FIG. 3B.

FIG. 3B depicts an exemplary method for performing the fine phase of determining an estimate of where a discontinuity is located as part of the method of FIG. 3A, according to the subject matter described herein. The method described in the context of FIG. 3B may be implemented by at least one processor or other circuitry in a computing device such as the exemplary computing device shown in FIG. 4 or a system comprising one or more computing devices such as the exemplary device shown in FIG. 4. The fine phase is the iterative refining of the discontinuity location using root-finding and simplified Newton iterations.

Referring to FIG. 3B, an approximation from the crude phase 312 was found using extrapolation. The approximation from the crude phase 312 is used as the first step size of the simplified Newton iteration. The solver performs simplified Newton iterations at block 314. The simplified Newton iterations are performed by a traditional implicit stiff solver. The simplified Newton iterations approximate the solution point $t_n + dt$, where $t_n$ is the current time and dt is the current step size. After the simplified Newton iterations have been performed, then the solver performs root-finding via the collocation polynomial, at block 316. The root-finding solves the equation $r(p_n(t_n + dt)) = 0$, where $p_n$ is the current collocation polynomial, r is the root-finding function, $t_n$ is the current time, and dt is the step size that is being solved for. In various embodiments, the root-finding may be performed, for example, using a bisection method, a regula falsi method, a Newton iteration, or the like.

At block 318, the solver determines whether the step size has converged. The convergence criterion is whether the current step size is sufficiently close to the previous step size. If the step size has converged, then the discontinuity point has been found (as shown in block 320). The discontinuity point is the point where the simplified Newton iterations stopped with the current step size. If the step size did not converge, then the solver returns to block 314 to perform more iterative refinements. The iterative refinements are performed using additional simplified Newton iterations (block 314) with an updated step size from the previous iteration, and then another root-finding process (block 316) to determine the future step size.

Figure 4:
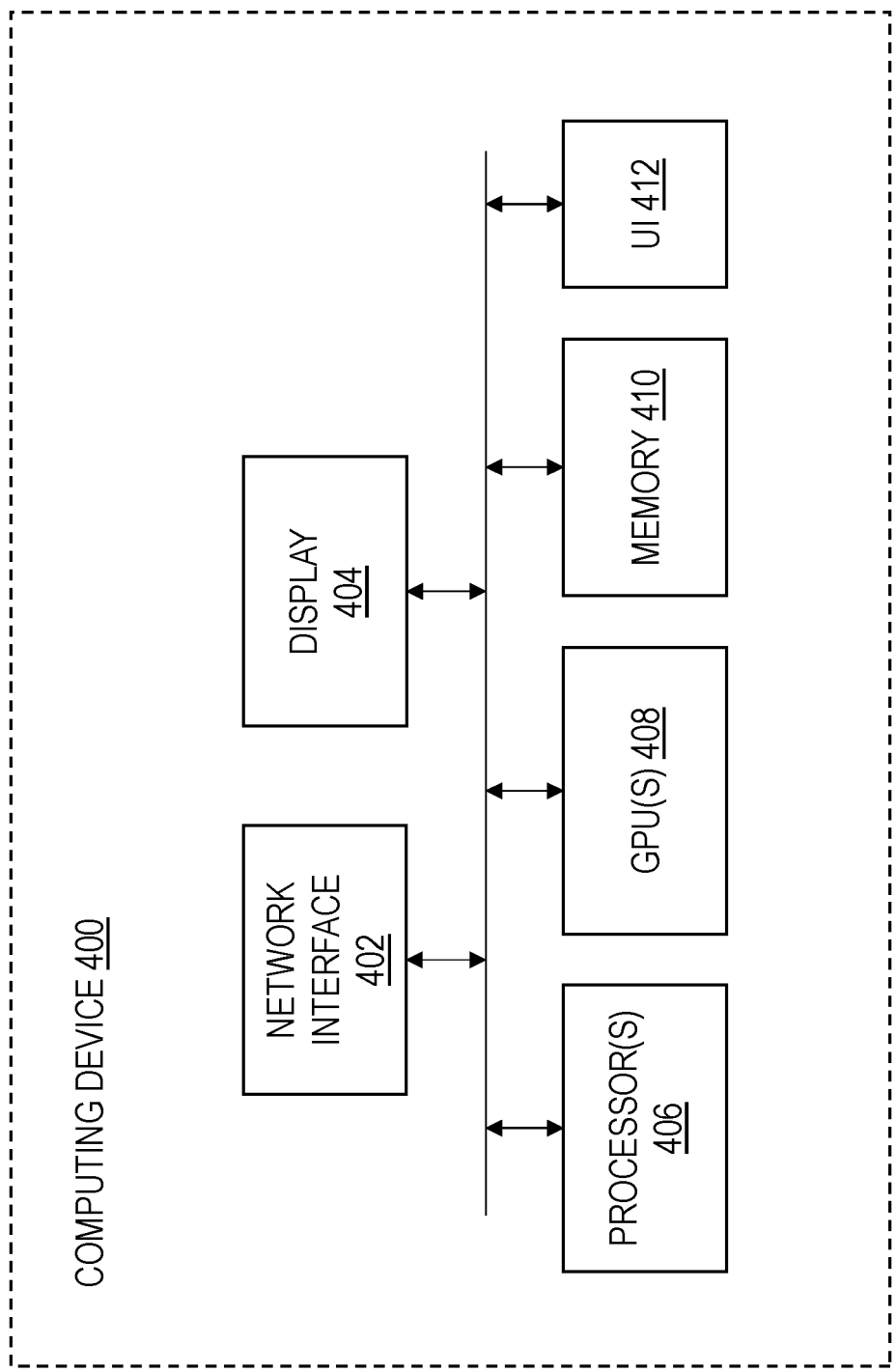
FIG. 4 depicts a block diagram illustrating one embodiment of a computing device that implements the solver for detecting discontinuities in a simulation in scientific computing described herein.

FIG. 4 depicts a block diagram illustrating one embodiment of a computing device that implements the solver for detecting discontinuities in a simulation in scientific computing described herein.

Referring to FIG. 4, the computing device 400 may include at least one processor 406, at least one graphical processing unit ("GPU") 408, a memory 410, a user interface ("UI") 412, a display 404, and a network interface 402. The memory 410 may be partially integrated with the processor(s) 406 and/or the GPU(s) 408. The UI 412 may include a keyboard and a mouse. The display 404 and the UI 412 may provide any of the GUIs in the embodiments of this disclosure.

To demonstrate the effectiveness of the solver described herein, this solver has been tested on a problem where a discontinuity was placed to occur at t=0.5. The solution of the equation u'(t)=1.01 when u(t)<1.5, and u'(t)=0.2 u when u(t)>=1.5 with a traditional backward differentiation formula ("BDF") solver (CVODE from the SUNDIALS suite) vs. the solver described herein, referred to as the DiscoRadau5 method, is shown in FIGS. 5A and 5B.

Figure 5A:
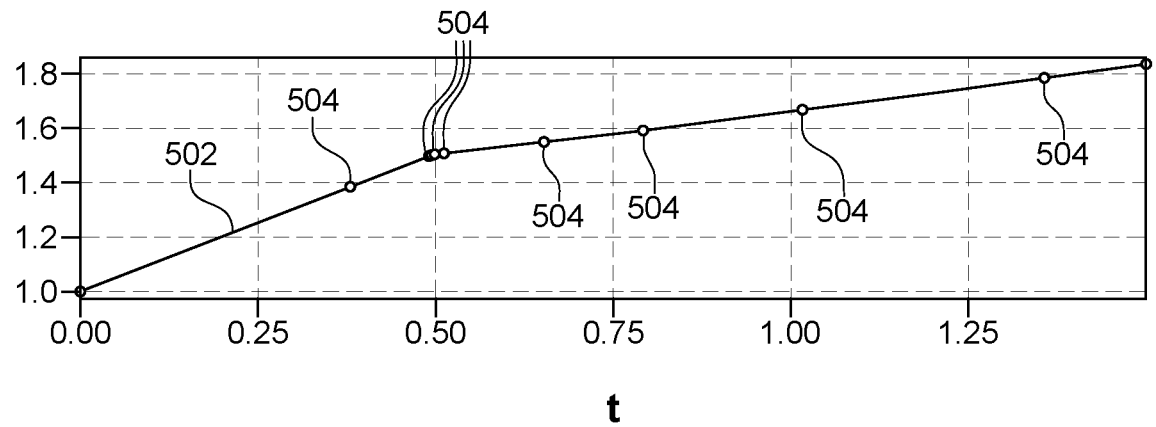
FIG. 5A depicts a graph showing the solution given by a traditional BDF solver on a problem where a discontinuity is placed to occur at t=0.5.
Figure 5B:
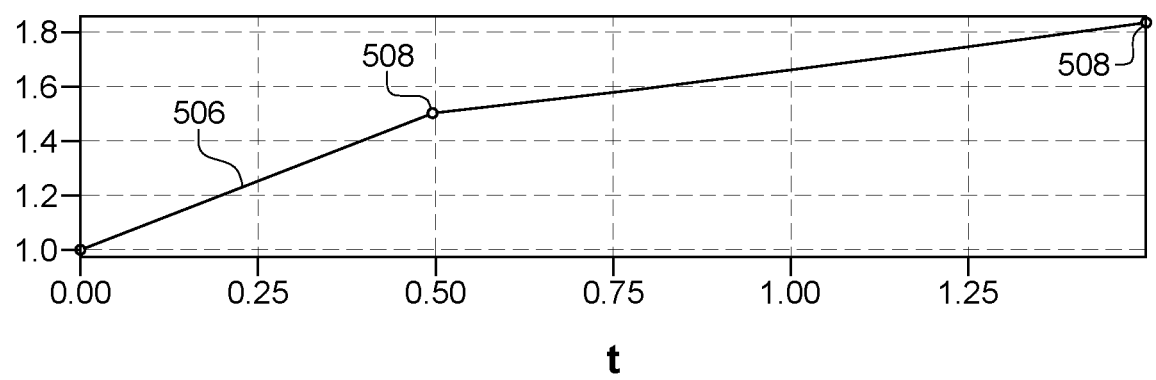
FIG. 5B depicts a graph showing the solution given by the solver described herein on a problem where a discontinuity is placed to occur at t=0.5, according to the subject matter disclosed herein.

FIGS. 5A and 5B show a comparison of a traditional BDF solver vs. the solver described herein. FIG. 5A shows the solution given by a traditional BDF solver on a problem where a discontinuity is placed to occur at t=0.5. FIG. 5B shows the solution given by the solver described herein on a problem where a discontinuity is placed to occur at t=0.5.

Referring to FIG. 5A, line 502 represents the numerical solution of the ODE given by the numerical solvers (a traditional BDF solver). The traditional BDF solver takes its respective steps at the points 504 shown on line 502. Referring to FIG. 5B, line 506 represents the numerical solution of the ODE given by the solver described herein. The solver described herein takes its respective steps at the points 508 shown on line 506. FIG. 5A shows the results 502 from a traditional BDF solver with the steps 504 used in the solver. As can be seen, the traditional BDF solver used many steps 504, with small steps occurring around the discontinuity at 0.50. FIG. 5B shows the results 506 from the solver described herein with the steps 508 used in the solver. As can be seen, the solver described herein handles the irregularity in the state correctly. As can further be seen in FIG. 5B, the solver described herein takes many fewer steps than the traditional solver shown in FIG. 5A. It takes many fewer steps when solving hybrid models.

Around the discontinuity, the BDF solver shown FIG. 5A requires taking an order of magnitude more steps than necessary to finally take a small step over the discontinuity at sufficiently high accuracy. After handling the discontinuity, the adaptive integration technique must then recover, building up a new history without the effects of the discontinuity and start to relearn that the equation is actually simple, slowly increasing the time step size until it is finally able to finish. The DiscoRadau5 solver described herein shown in FIG. 5B automatically detects the discontinuity point and steps to it, and then steps to the end of the simple system.

A person having ordinary skill in the art will recognize that the principles described herein may be applied to other simulation or solver systems not explicitly described herein, as the model described herein here provides a framework that is not specific to any particular simulation or solver system but rather can be used to detect discontinuities of any simulation or solver system.

The descriptions of the various embodiments of the technology disclosed herein have been presented for purposes of illustration, but these descriptions are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the solver described herein may be embodied as a system, method, or computer program product. Accordingly, aspects of the solver described herein may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the solver described herein may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium (including, but not limited to, non-transitory computer readable storage media). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

More particularly, the apparatuses described above may perform the methods herein and any other processing by implementing any functional means, modules, units, or circuitry. In one embodiment, for example, the apparatuses comprise respective circuits or circuitry configured to perform the steps shown in the method figures. The circuits or circuitry in this regard may comprise circuits dedicated to performing certain functional processing and/or one or more microprocessors in conjunction with memory. For instance, the circuitry may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory, cache memory, flash memory devices, optical storage devices, etc. Program code stored in memory may include program instructions for executing one or more telecommunications and/or data communications protocols as well as instructions for carrying out one or more of the techniques described herein, in several embodiments. In embodiments that employ memory, the memory stores program code that, when executed by the one or more processors, carries out the techniques described herein.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the solver described herein may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Machine learning (ML) is the use of computer algorithms that can improve automatically through experience and by the use of data. Machine learning algorithms build a model based on sample data, known as training data, to make predictions or decisions without being explicitly programmed to do so. Machine learning algorithms are used where it is unfeasible to develop conventional algorithms to perform the needed tasks.

In certain embodiments, instead of or in addition to performing the functions described herein manually, the system may perform some or all of the functions using machine learning or artificial intelligence. Thus, in certain embodiments, machine learning-enabled software relies on unsupervised and/or supervised learning processes to perform the functions described herein in place of a human user.

Machine learning may include identifying one or more data sources and extracting data from the identified data sources. Instead of or in addition to transforming the data into a rigid, structured format, in which certain metadata or other information associated with the data and/or the data sources may be lost, incorrect transformations may be made, or the like, machine learning-based software may load the data in an unstructured format and automatically determine relationships between the data. Machine learning-based software may identify relationships between data in an unstructured format, assemble the data into a structured format, evaluate the correctness of the identified relationships and assembled data, and/or provide machine learning functions to a user based on the extracted and loaded data, and/or evaluate the predictive performance of the machine learning functions (e.g., "learn" from the data).

Machine learning-based software may include a model generator, a training data module, a model processor, a model memory, and a communication device. Machine learning-based software may be configured to create prediction models based on the training data. In some embodiments, machine learning-based software may generate decision trees. For example, machine learning-based software may generate nodes, splits, and branches in a decision tree. Machine learning-based software may also calculate coefficients and hyper parameters of a decision tree based on the training data set. In other embodiments, machine learning-based software may use Bayesian algorithms or clustering algorithms to generate predicting models. In yet other embodiments, machine learning-based software may use association rule mining, artificial neural networks, and/or deep learning algorithms to develop models. In some embodiments, to improve the efficiency of the model generation, machine learning-based software may utilize hardware optimized for machine learning functions, such as an FPGA.

The system disclosed herein may be implemented as a client/server type architecture but may also be implemented using other architectures, such as cloud computing, software as a service model (SaaS), a mainframe/terminal model, a stand-alone computer model, a plurality of non-transitory lines of code on a computer readable medium that can be loaded onto a computer system, a plurality of non-transitory lines of code downloadable to a computer, and the like.

The system may be implemented as one or more computing devices that connect to, communicate with and/or exchange data over a link that interact with each other. Each computing device may be a processing unit-based device with sufficient processing power, memory/storage and connectivity/communications capabilities to connect to and interact with the system. For example, each computing device may be a personal computer, a tablet computer, a laptop computer and the like, and the system is not limited to operate with any particular computing device. The link may be any wired or wireless communications link that allows the one or more computing devices and the system to communicate with each other. The system may be implemented as one or more server computers (all located at one geographic location or in disparate locations) that execute a plurality of lines of non-transitory computer code to implement the functions and operations of the system as described herein. Alternatively, the system may be implemented as a hardware unit in which the functions and operations of the system are programmed into a hardware system. In one implementation, the one or more server computers may use Intel® processors, run the Linux operating system, and execute Java, Ruby, Regular Expression, Flex 4.0, SQL etc.

In some embodiments, each computing device may further comprise a display and a browser application so that the display can display information generated by the system. The browser application may be a plurality of non-transitory lines of computer code executed by a processing unit of the computing device. Each computing device may also have the usual components of a computing device such as one or more processing units, memory, permanent storage, wireless/wired communication circuitry, an operating system, etc.

The system may further comprise a server (that may be software based or hardware based) that allows each computing device to connect to and interact with the system such as sending information and receiving information from the computing devices that is executed by one or more processing units. The system may further comprise software- or hardware-based modules and database(s) for processing and storing content associated with the system, metadata generated by the system for each piece of content, user preferences, and the like.

In one embodiment, the system includes one or more processors, server, clients, data storage devices, and non-transitory computer readable instructions that, when executed by a processor, cause a device to perform one or more functions. It is appreciated that the functions described herein may be performed by a single device or may be distributed across multiple devices.

When a user interacts with the system, the user may use a front-end client application. The client application may include a GUI that allows the user to select one or more digital files. The client application may communicate with a backend cloud component using an application programming interface (API) comprising a set of definitions and protocols for building and integrating application software.

Software-as-a-service (SaaS) is a software licensing and delivery model in which software is licensed on a subscription basis and is centrally hosted. SaaS is typically accessed by users using a thin client, e.g., via a web browser. SaaS is considered part of the nomenclature of cloud computing.

Many SaaS solutions are based on a multitenant architecture. With this model, a single version of the application, with a single configuration (hardware, network, operating system), is used for all customers ("tenants"). To support scalability, the application is installed on multiple machines (called horizontal scaling). The term "software multi-tenancy" refers to a software architecture in which a single instance of software runs on a server and serves multiple tenants. Systems designed in such manner are often called shared (in contrast to dedicated or isolated). A tenant is a group of users who share a common access with specific privileges to the software instance. With a multitenant architecture, a software application is designed to provide every tenant a dedicated share of the instance—including its data, configuration, user management, tenant individual functionality and non-functional properties.

The backend cloud component described herein may also be referred to as a SaaS component. One or more tenants which may communicate with the SaaS component via a communications network, such as the Internet. The SaaS component may be logically divided into one or more layers, each layer providing separate functionality and being capable of communicating with one or more other layers.

Cloud storage may store or manage information using a public or private cloud. Cloud storage is a model of computer data storage in which the digital data is stored in logical pools. The physical storage spans multiple servers (sometimes in multiple locations), and the physical environment is typically owned and managed by a hosting company. Cloud storage providers are responsible for keeping the data available and accessible, and the physical environment protected and running. People and/or organizations buy or lease storage capacity from the providers to store user, organization, or application data. Cloud storage services may be accessed through a co-located cloud computing service, a web service API, or by applications that utilize the API.

What is claimed is:

1. A method for detecting discontinuities in a simulation by a solver in scientific computing, the method comprising:
   constructing a collocation polynomial over an integration interval;
   determining an estimate of a point within the integration interval where a discontinuity is located; and
   refining the estimate of the point where the discontinuity is located, wherein the estimate is refined using root-finding and simplified Newton iterations.

2. The method of claim 1, wherein the collocation polynomial represents a non-linear system being modeled by the simulation.

3. The method of claim 1, wherein the estimate is determined based on where a solution to the collocation polynomial equals zero.

4. The method of claim 1, wherein a root-finding problem for the root-finding is generated from a symbolic domain representation, wherein the symbolic domain representation is scanned for irregularities.

5. The method of claim 1, wherein step size is placed such that the discontinuity is captured by a step of the solver.

6. The method of claim 1, wherein the root-finding is performed on the collocation polynomial to refine an initial guess of an estimate of a solution of the collocation polynomial.

7. A method for detecting discontinuities in a simulation by a solver in scientific computing, the method comprising:
   constructing a collocation polynomial over an integration interval;

determining an estimate of a point within the integration interval where a discontinuity is located; and refining the estimate of the point where the discontinuity is located, wherein the estimate is refined using root-finding and simplified Newton iterations, and wherein refining the estimate of the point where the discontinuity is located comprises:

performing simplified Newton iterations with an estimate of a step size;

performing root-finding via the collocation polynomial to update the estimate of the step size; and while the step size has not converged:
performing additional simplified Newton iterations using the updated estimate of the step size; and performing additional root-finding via the collocation polynomial to update the estimate of the step size.

8. The method of claim 7, wherein the collocation polynomial represents a non-linear system being modeled by the simulation.

9. The method of claim 7, wherein the estimate is determined based on where a solution to the collocation polynomial equals zero.

10. The method of claim 7, wherein a root-finding problem for the root-finding is generated from a symbolic domain representation, wherein the symbolic domain representation is scanned for irregularities.

11. The method of claim 7, wherein step size is placed such that the discontinuity is captured by a step of the solver.

12. The method of claim 7, wherein an initial value for the estimate of the step size is determined by extrapolating an interpolant of the collocation polynomial.

13. The method of claim 7, wherein the point within the integration interval where the discontinuity is located is found when step size converges.

14. A computing device with a solver for detecting discontinuities in a simulation by in scientific computing, the computing device comprising:

a memory; and at least one processor configured for:

constructing a collocation polynomial over an integration interval;

determining an estimate of a point within the integration interval where a discontinuity is located; and refining the estimate of the point where the discontinuity is located, wherein the estimate is refined using root-finding and simplified Newton iterations, and wherein refining the estimate of the point where the discontinuity is located comprises:

performing simplified Newton iterations with an estimate of a step size;

performing root-finding via the collocation polynomial to update the estimate of the step size; and while the step size has not converged:
performing additional simplified Newton iterations using the updated estimate of the step size; and performing additional root-finding via the collocation polynomial to update the estimate of the step size.

15. The computing device of claim 14, wherein the collocation polynomial represents a non-linear system being modeled by the simulation.

16. The computing device of claim 14, wherein the estimate is determined based on where a solution to the collocation polynomial equals zero.

17. The computing device of claim 14, wherein a root-finding problem for the root-finding is generated from a symbolic domain representation, wherein the symbolic domain representation is scanned for irregularities.

18. The computing device of claim 14, wherein step size is placed such that the discontinuity is captured by a step of the solver.

19. The computing device of claim 14, wherein the root-finding is performed on the collocation polynomial to refine an initial guess of the estimate of the solution of the collocation polynomial.

20. The computing device of claim 14, wherein the simplified Newton iterations are performed by an implicit stiff solver.

* * * * *